(12) United States Patent
Cheng et al.

(10) Patent No.: US 8,927,387 B2
(45) Date of Patent: Jan. 6, 2015

(54) ROBUST ISOLATION FOR THIN-BOX ETSOI MOSFETS

(75) Inventors: Kangguo Cheng, Schenectady, NY (US); Bruce B Doris, Slingerlands, NY (US); Balasubramanian S Haran, Watervliet, NY (US); Sanjay Mehta, Niskayuna, NY (US); Stefan Schmitz, Ballston Spa, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/442,168

(22) Filed: Apr. 9, 2012

(65) Prior Publication Data

US 2013/0264641 A1   Oct. 10, 2013

(51) Int. Cl.
*H01L 27/088* (2006.01)
*H01L 21/336* (2006.01)
*H01L 21/762* (2006.01)

(52) U.S. Cl.
USPC ........... 438/424; 257/347; 438/427; 438/435; 438/479

(58) Field of Classification Search
CPC .............. H01L 21/823481; H01L 21/823878; H01L 27/1203; H01L 21/76283; H01L 21/76229; H01L 21/76264
USPC ................... 257/347; 438/424, 427, 435, 479
See application file for complete search history.

(56) References Cited

U.S. PATENT DOCUMENTS

| | | | |
|---|---|---|---|
| 5,183,771 A | 2/1993 | Mitsui et al. | |
| 5,714,413 A | 2/1998 | Brigham et al. | |
| 5,904,541 A * | 5/1999 | Rho et al. | 438/433 |
| 5,972,758 A * | 10/1999 | Liang | 438/294 |
| 6,254,620 B1 | 7/2001 | Koh et al. | |
| 6,294,423 B1 * | 9/2001 | Malik et al. | 438/241 |
| 6,313,008 B1 * | 11/2001 | Leung et al. | 438/424 |
| 6,483,172 B1 * | 11/2002 | Cote et al. | 257/639 |
| 6,518,641 B2 * | 2/2003 | Mandelman et al. | 257/510 |
| 6,548,357 B2 | 4/2003 | Weybright et al. | |
| 6,607,967 B1 * | 8/2003 | Pallinti et al. | 438/411 |
| 6,649,964 B2 * | 11/2003 | Kim | 257/308 |
| 6,784,076 B2 * | 8/2004 | Gonzalez et al. | 438/426 |
| 6,946,696 B2 * | 9/2005 | Chan et al. | 257/250 |

(Continued)

OTHER PUBLICATIONS

E. Chen, "III. Wet and Dry Etching", Apr. 12, 2004, Harvard University, Applied Physics 298r, pp. 1-18.*

(Continued)

*Primary Examiner* — Khiem D Nguyen
*Assistant Examiner* — Pauline Vu
(74) *Attorney, Agent, or Firm* — Cantor Colburn LLP; Vazken Alexanian (57) ABSTRACT

A thin BOX ETSOI device with robust isolation and method of manufacturing. The method includes providing a wafer with at least a pad layer overlying a first semiconductor layer overlying an oxide layer overlying a second semiconductor layer, wherein the first semiconductor layer has a thickness of 10 nm or less. The process continues with etching a shallow trench into the wafer, extending partially into the second semiconductor layer and forming first spacers on the sidewalls of said shallow trench. After spacer formation, the process continues by etching an area directly below and between the first spacers, exposing the underside of the first spacers, forming second spacers covering all exposed portions of the first spacers, wherein the pad oxide layer is removed, and forming a gate structure over the first semiconductor wafer.

11 Claims, 7 Drawing Sheets

(56) References Cited

U.S. PATENT DOCUMENTS

| | | | |
|---|---|---|---|
| 7,153,753 B2* | 12/2006 | Forbes | 438/404 |
| 7,230,270 B2* | 6/2007 | Chen et al. | 257/67 |
| 7,442,618 B2* | 10/2008 | Chong et al. | 438/424 |
| 7,622,778 B2* | 11/2009 | Lee et al. | 257/374 |
| 7,700,416 B1* | 4/2010 | Clifton et al. | 438/142 |
| 7,704,835 B2 | 4/2010 | Singh et al. | |
| 7,705,417 B2 | 4/2010 | Oishi | |
| 7,799,694 B2* | 9/2010 | Alapati et al. | 438/714 |
| 7,818,702 B2* | 10/2010 | Mandelman et al. | 716/118 |
| 7,883,953 B2* | 2/2011 | Zhang et al. | 438/199 |
| 7,935,602 B2* | 5/2011 | Wang et al. | 438/296 |
| 2001/0026996 A1* | 10/2001 | Ishitsuka et al. | 438/437 |
| 2002/0039835 A1* | 4/2002 | Balsan et al. | 438/597 |
| 2002/0070420 A1* | 6/2002 | Oh et al. | 257/506 |
| 2005/0136588 A1* | 6/2005 | Speyer | 438/221 |
| 2005/0139952 A1* | 6/2005 | Koh | 257/510 |
| 2005/0142804 A1* | 6/2005 | Shin | 438/424 |
| 2005/0153519 A1* | 7/2005 | Lu et al. | 438/424 |
| 2006/0220146 A1* | 10/2006 | Takeda et al. | 257/374 |
| 2006/0223279 A1* | 10/2006 | Patraw et al. | 438/427 |
| 2006/0223290 A1* | 10/2006 | Belyansky et al. | 438/520 |
| 2007/0059897 A1* | 3/2007 | Tilke et al. | 438/424 |
| 2007/0141852 A1* | 6/2007 | Stapelmann et al. | 438/758 |
| 2007/0212848 A1* | 9/2007 | Sandhu et al. | 438/424 |
| 2007/0224775 A1* | 9/2007 | Lindert | 438/424 |
| 2008/0283935 A1* | 11/2008 | Sridhar et al. | 257/390 |
| 2009/0160031 A1* | 6/2009 | Kim | 257/622 |
| 2010/0038745 A1* | 2/2010 | Wu et al. | 257/510 |
| 2010/0213522 A1* | 8/2010 | Cheng et al. | 257/301 |
| 2010/0258869 A1* | 10/2010 | Morita et al. | 257/347 |
| 2011/0024840 A1* | 2/2011 | Khater | 257/347 |
| 2011/0037125 A1* | 2/2011 | Cheng et al. | 257/351 |
| 2011/0115021 A1* | 5/2011 | Dennard et al. | 257/347 |

OTHER PUBLICATIONS

S. Mayuzumi et al., "High-Performance Metal/High-k n- and p-MOSFETs Top-Cut Dual Stress Liners . . . ," IEEE Transactions on Electron Devices, 2009, pp. 620-626 vol. 56, issue 4.

R. A. Vega et al., "Low-Standby-Power Bulk MOSFET Design Using High-k Trench Isolation," IEEE Electron Device Letters, Dec. 2009, pp. 1380-1382, vol. 30, Issue: 12.

* cited by examiner

FIG. 9

ROBUST ISOLATION FOR THIN-BOX ETSOI MOSFETS

BACKGROUND OF THE INVENTION

1. Field of the Invention

The present invention generally relates to ETSOI MOSFETS, and more specifically to robust isolation for ETSOI MOSFETS.

2. Description of Related Art

Metal Oxide Semiconductor Field Effect Transistors (MOSFETS) are commonly used today in almost all electronic circuit applications. An emerging technology in the field of semiconductor-on-insulator (SOI) FET devices is the extremely thin semiconductor-on-insulator (ETSOI) MOSFET. Such a device shows excellent short channel control, which is desirable. With the trend toward continued scaling of MOSFET devices, ETSOI is a promising candidate for next generation technology.

There are, however, several manufacturing issues that can limit yield. Specifically, as the STI divot erodes as a function of the HF based cleaning and other process steps during manufacturing, the back gate or substrate wafer is exposed, leaving it susceptible to shorting due to source/drain epitaxial growth and unwanted metal gate connections, among other processes.

Figure 1A:
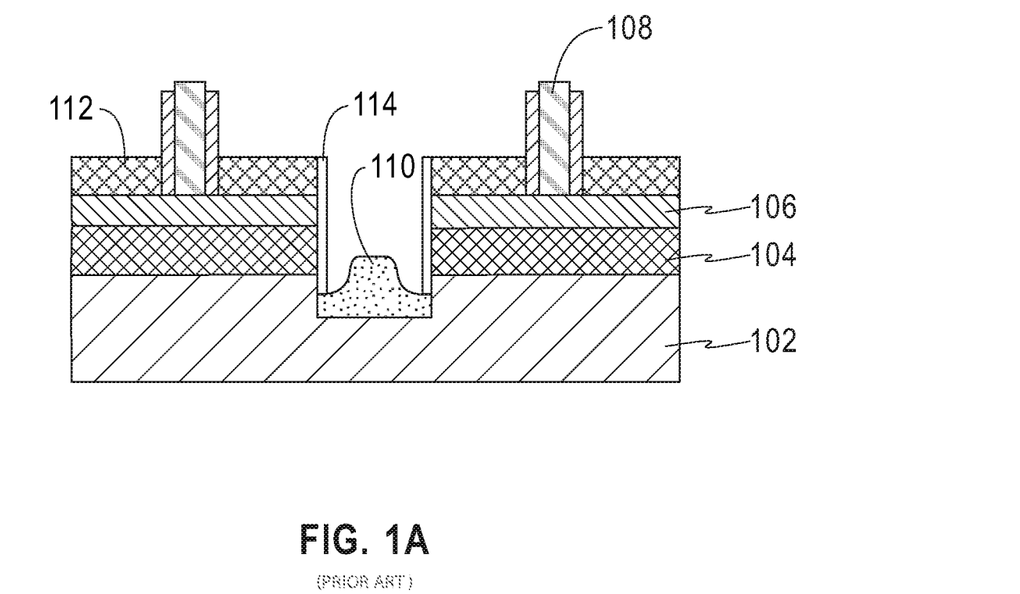
FIG. 1A is a prior art illustration of an ETSOI device with epitaxial growth shorting.

Referring now to FIG. 1A, a problem inherent in some current ETSOI devices is illustrated. FIG. 1A illustrates a wafer including a substrate 102, a buried oxide layer 104 and an ETSOI layer 106. It also includes raised source/drain regions overlying the ETSOI layer 106 and adjacent to the gate structures 108. Also shown is a dielectric 110 within the illustrated shallow trench isolation region. During normal processing, epitaxially grown silicon can develop along the sidewall of the shallow trench isolation region. In FIG. 1A, this is illustrated as epitaxially grown silicon 114. As illustrated in FIG. 1A, epitaxially grown silicon 114 forms an unwanted connection from the substrate 102 to the raised source/drain region 112.

Figure 1B:
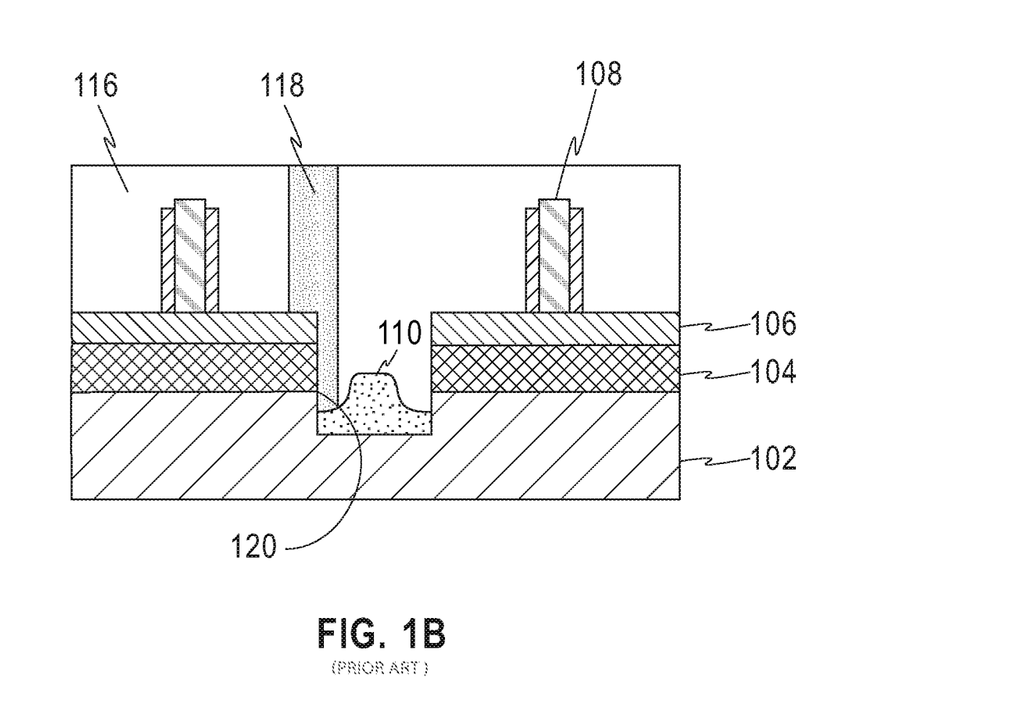
FIG. 1B is a prior art illustration of an ETSOI device with a mis-aligned contact and shorting due to the metal filling.

Referring now to FIG. 1B, another problem inherent in some current ETSOI devices is illustrated. FIG. 1B illustrates the device after the deposition of a pre-metal dielectric 116 and the formation of contact holes. In the case of a mis-aligned contact hole 118, the hole can be etched partially into the shallow trench. This presents a problem when metal is later added, as it can also create a short between the substrate 102 and a raised source/drain region

BRIEF SUMMARY OF THE INVENTION

To overcome these deficiencies, the present invention provides a method of manufacturing a semiconductor device, including: providing a wafer including at least a pad layer overlying a first semiconductor layer overlying an oxide layer overlying a second semiconductor layer, wherein the first semiconductor layer has a thickness of 10 nm or less; etching a shallow trench into the wafer, extending partially into the second semiconductor layer; forming first spacers on the sidewalls of the shallow trench; etching an area directly below and between the first spacers, exposing the underside of the first spacers; forming second spacers covering all exposed portions of the first spacers, wherein the pad oxide layer is removed; and forming a gate structure over the first semiconductor wafer.

According to another aspect, the present invention provides a semiconductor device, including: a first semiconductor layer overlying an oxide layer overlying a second semiconductor layer, wherein the first semiconductor layer has a thickness of 10 nm or less; at least one shallow trench isolation region extending partially into the second semiconductor layer, separating regions of the semiconductor device; a first sidewall spacer adjacent to the sidewall of the shallow trench isolation region, extending from the first semiconductor layer to the semiconductor layer, wherein a gap exists between the bottom of the first sidewall spacer and the bottom of the shallow trench isolation region; a second sidewall spacer covering the first sidewall spacer and completely filling the gap; and a gate structure overlying the first semiconductor layer.

According to yet another aspect, the present invention provides a method of manufacturing a semiconductor device, including: providing a wafer including at least a pad layer overlying a first semiconductor layer overlying an oxide layer overlying a second semiconductor layer, wherein the first semiconductor layer has a thickness of 10 nm or less; etching a shallow trench into the wafer, extending until the second semiconductor layer; forming first spacers on the sidewalls of the shallow trench; etching an area directly below and between the first spacers, exposing the underside of the first spacers; forming second spacers covering all exposed portions of the first spacers, wherein the pad oxide layer is removed; and forming a gate structure over the first semiconductor wafer.

DETAILED DESCRIPTION OF THE PREFERRED EMBODIMENTS

Figure 2A:
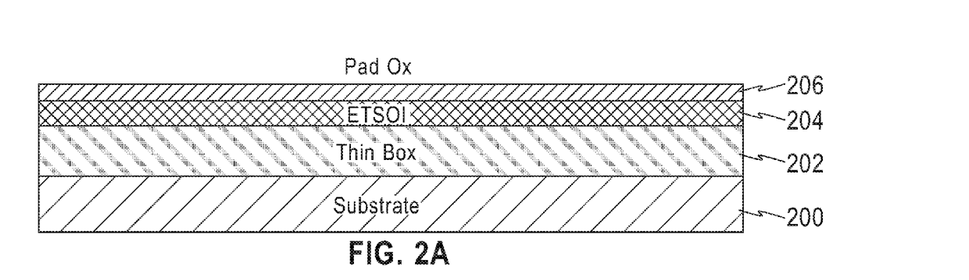
FIG. 2A is a starting wafer according to an embodiment of the invention.

Referring now to FIG. 2A, a starting wafer according to an embodiment of the invention is presented. This embodiment includes a substrate layer 200, a thin buried oxide (thin BOX) layer 202, an extremely thin silicon-on-insulator layer (ET-SOI) 204 and a pad layer 206 as the starting wafer. The present invention is not limited to this setup, and other starting wafer setups containing alternative layers can be used.

In an embodiment, the substrate layer 200 is silicon. In other embodiments, different semiconductor materials can be used, including but not limited to strained silicon, silicon germanium, silicon alloys, germanium, germanium alloys.

In an embodiment, a thin buried oxide layer (thin BOX) 202, i.e. an insulating layer, overlies the substrate layer 200. In an embodiment, thin BOX layer 202 can be deposited or grown prior to the formation of ETSOI layer 204. In other embodiments, wafer bonding techniques can be used, using glue, adhesive polymer, or direct bonding. In yet another embodiment, a high energy dopant can be implanted into the substrate 200 and annealed to form thin BOX layer 202.

In an embodiment, ETSOI layer 204 includes silicon. In other embodiments, ETSOI layer 204 can include any known semiconductor material, including but not limited to strained silicon, silicon germanium, silicon alloys, germanium, germanium alloys, and the like. ETSOI layer 204 can be reduced to the desired thickness by any method as is known in the art, including planarization, grinding and etching. In an embodiment, ETSOI layer 204 has a thickness ranging from 1 to 10 nm.

In an embodiment, pad layer 206 ETSOI layer 204. In an embodiment, pad layer 206 is pad oxide layer 206. Pad oxide layer 206 includes, for example, silicon dioxide. In an embodiment, pad oxide layer 206 has an overall thickness of 2 to 10 nm.

Figure 2B:
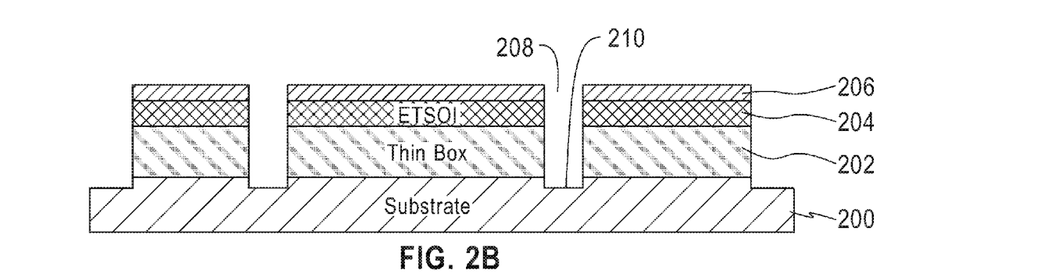
FIG. 2B illustrates the formation of shallow trenches according to an embodiment of the invention.

Referring now to FIG. 2B, a shallow trench isolation (STI) region 208 is defined. The dimensions of the trench formed are relevant to the size of the device and dependent on the technology for which the device is being used. In an embodiment, the width of the STI region 208 is in a range of 30-60 nm. As illustrated in FIG. 2B, the STI can be formed by selectively removing portions of the pad oxide 206, the ETSOI layer 204, the thin BOX 202, and the substrate 200. In one embodiment, as shown in FIG. 2B, the bottom 210 of the STI 208 extends partially into substrate 200, e.g. by approximately 5 nm. In other embodiments, it extends until reaching the substrate 200 without etching into it. In an embodiment, the shallow trench isolation is formed by known techniques of lithography, masking and etching.

Figure 3A:
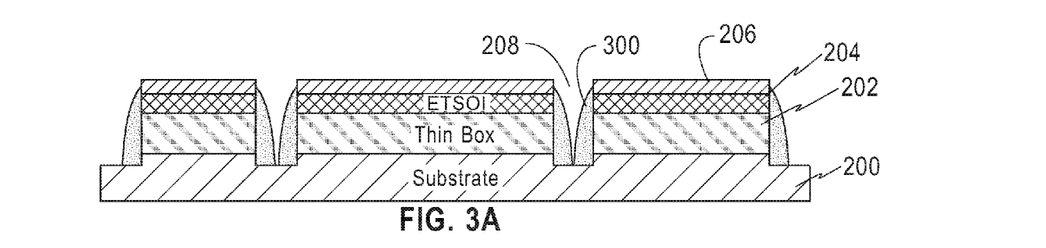
FIG. 3A illustrates the formation of first spacers according to an embodiment of the invention.

Referring now to FIG. 3A, furnace silicon nitride 300 is deposited using low pressure chemical vapor deposition (LPCVD). In an alternative embodiment, it can be deposited using plasma enhanced chemical vapor deposition (PECVD). In other embodiments, alternative spacer materials can be used as are known in the art.

In a next processing step, the furnace silicon nitride is removed from all horizontal surfaces using an anisotropic etch process. In an embodiment this is done using plasma Reactive Ion Etching (RIE), a highly directional etching process where the ions are normal to the surface, a preferred direction, which facilitates the removal of the silicon nitride from the horizontal surfaces but leaves a layer on the vertical surfaces. The end result of this process is the formation of spacers 300 on the sidewalls of the STI 208. In the embodiment illustrated in FIG. 3A, the bottom 210 of the STI 208 extends about 5 nm into the substrate 300. As a result of this, the spacer 300 covers the 5 nm on the sidewall of the substrate 200. In an embodiment where the bottom 210 of the substrate does not extend into the substrate 200, the spacers 300 would not cover any of the sidewall of the substrate 200.

Figure 3B:
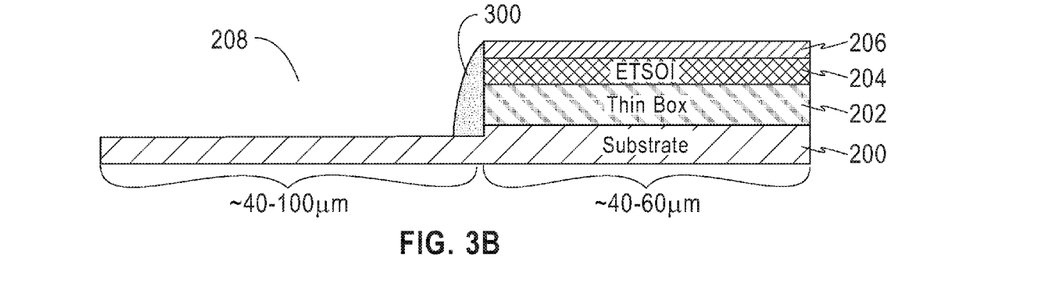
FIG. 3B illustrates an alternative embodiment with larger shallow trenches.

Referring now to FIG. 3B, an alternative embodiment is shown. In this embodiment, large pads are used with the transistors built as isolated features as opposed to separated by shallow trenches. In this embodiment, the spacing between semiconductor layers can be between 40 and 100 μm, as is illustrated in FIG. 3B. The processing steps taken to this point, however, remain the same. In this embodiment, feature 208 represents the large void in between the transistor locations.

Figure 4A:
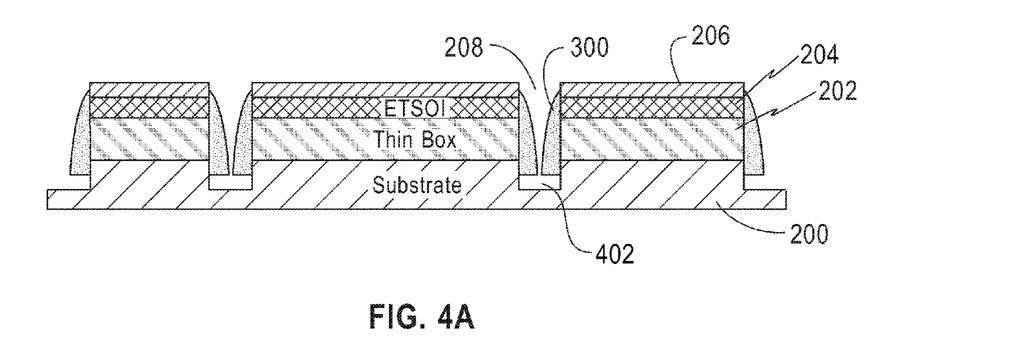
FIG. 4A illustrates additional etching of the shallow trenches according to an embodiment of the invention.

Referring now to FIG. 4A, an additional etching step is performed. In this step, the STI 208 is etched further into the substrate 200, opening up a void below the spacers 300. In a first etching step, an isotropic etch is performed, done primarily to etch the space between and below the recently formed spacers 300. In an embodiment, a wet, isotropic etch is performed using potassium hydroxide (KOH) as the wet etchant. In other embodiments, different types of wet etchants can be used, as are known in the art.

Figure 4B:
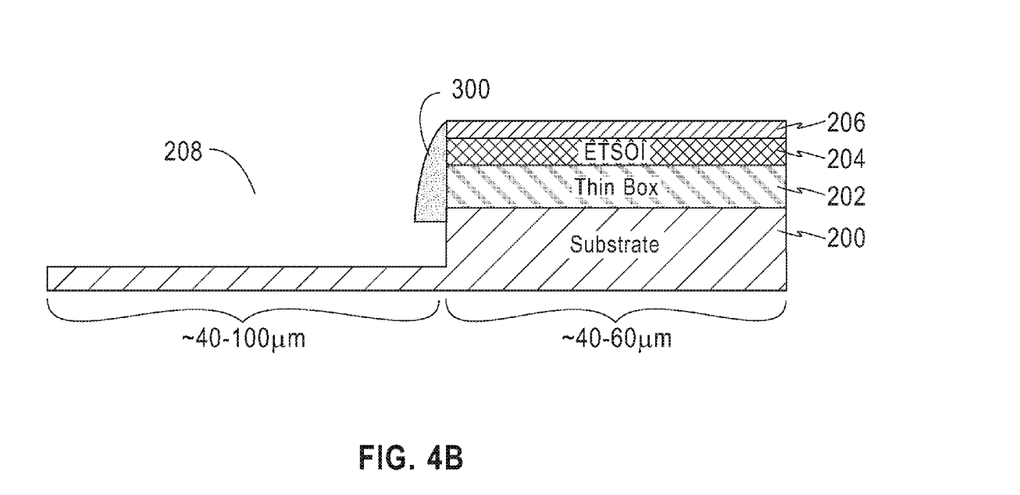
FIG. 4B illustrates an alternative embodiment with large shallow trenches and additional etching.

Following the isotropic etch, a dry, anisotropic etch can be performed to clear out the space 402 underneath the spacers 300. In an embodiment, plasma RIE can be used to etch the space 402 as illustrated in FIG. 4A. This anisotropic etching process uses the hole created by the isotropic etch to carve out sidewalls below the spacers 300, and will later be filled with another insulating material. In an embodiment, these two etching processes combine to extend bottom of the previously etched STI 208 an additional 10-100 nm into the substrate. In another embodiment, this same process can be carried out on a wafer with large pads/isolated features, as illustrated in FIG. 4B.

Figure 5A:
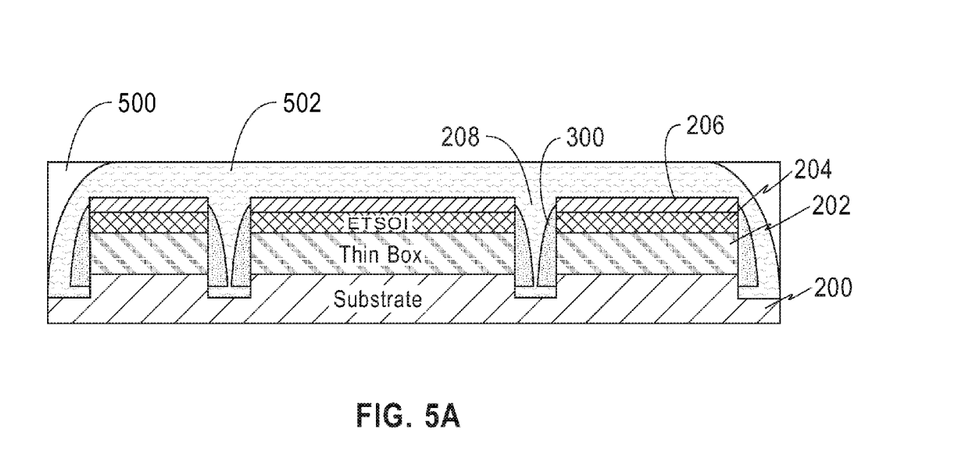
FIG. 5A illustrates the addition of insulating materials to the device according to an embodiment of the invention.

Referring now to FIG. 5A, this embodiment continues with the addition of two more materials. In one processing step, a layer of insulating material 502 is deposited over the device. In an example, a hydrogen rich nitride, such as hydrogen rich silicon nitride is deposited. Insulating material 502 can be deposited by any number of known techniques, including but not limited to PECVD and LPCVD. In the embodiment shown in FIG. 5A, insulating material 502 completely fills the STI locations including the recently opened void 402.

In a next processing step, an oxide material 500 is deposited over the device. In an embodiment, high density plasma oxide can be used. In other embodiments, spin-on oxide or spin-on glass can be used.

Figure 5B:
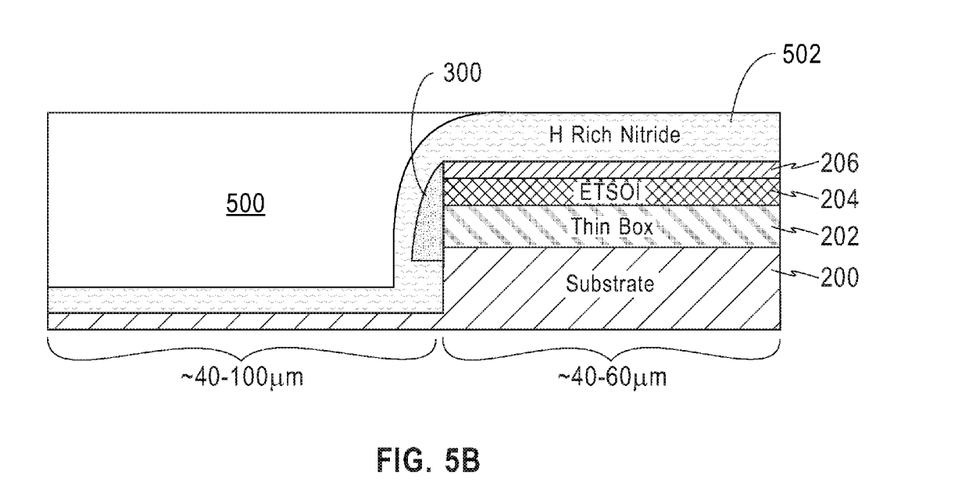
FIG. 5B illustrates an alternative embodiment with the addition of insulating materials.

In a next processing step, a chemical mechanical polishing (CMP) is performed, stopping on the insulating material 502. This removes most of the oxide material 500 except for on the outer edges, away from the transistor regions. This is illustrated in FIG. 5A. FIG. 5B is an alternative embodiment using large pads/isolated features. The process to get to this point, however, is the same. Notably, in the embodiment of FIG. 5B, there is more oxide material 500 remaining due to the larger void between features.

Figure 6A:
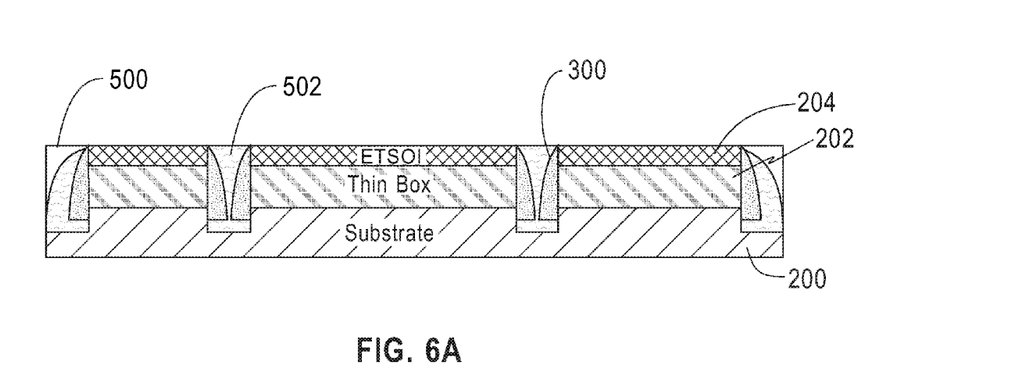
FIG. 6A illustrates the device after removing several layers.

Referring now to FIG. 6A, some of the insulating material 502 and oxide 500 are removed. In an embodiment using hydrogen rich silicon nitride as the insulating material 502, a directional nitride etch can be performed to remove it, for example a directional RIE process. Due in part to the directional nature of the etching process, the insulating material 502 inside the STI 208 remains. Other processes to remove the excess hydrogen rich nitride as are known in the art can be used here as well.

In a next processing step, the pad oxide 206 is stripped from the device, exposing the ETSOI layer 204. In an embodiment, a hydrofluoric acid (HF) etch can be performed to strip the pad oxide. The oxide material 500 can also be reduced to a level equal with the ETSOI layer 204 in this or a separate etching step, depending on the embodiment and the materials chosen.

Following the stripping of pad oxide 206, a high temperature densification anneal can be performed on the insulating layer 502. In an embodiment with hydrogen rich silicon nitride as the insulating layer 502, the high temperature densification anneal will densify the nitride.

As a result of these etching steps, the STI 208 now contains a spacer 300 covering the sidewalls of the ETSOI layer 204 and the thin BOX layer 202. In one embodiment, the sidewall spacer terminates at the substrate sidewall. This is dependent on, if during the initial STI process, the substrate was etched into or if the etching was terminated on contact with the substrate. In the embodiment shown, the substrate was etched into, e.g. by about 5 nm, and the spacer 300 will cover these additional 5 nm of the substrate sidewall.

In addition to the spacer 300, insulating material 502 has been added into the STI 208 and underneath the spacers 300. Insulating material 502 will later act as a second spacer when gate structures are added, adding an extra layer of protection. In this embodiment, the sidewall spacer 300 extends from ETSOI layer 204 into substrate layer 200. There is a gap between the bottom of sidewall spacer 300 and the bottom of STI 208. Insulating material 502 covers sidewall spacer 300, including completely filling the gap between the bottom of sidewall spacer 300 and the bottom of STI 208.

Figure 6B:
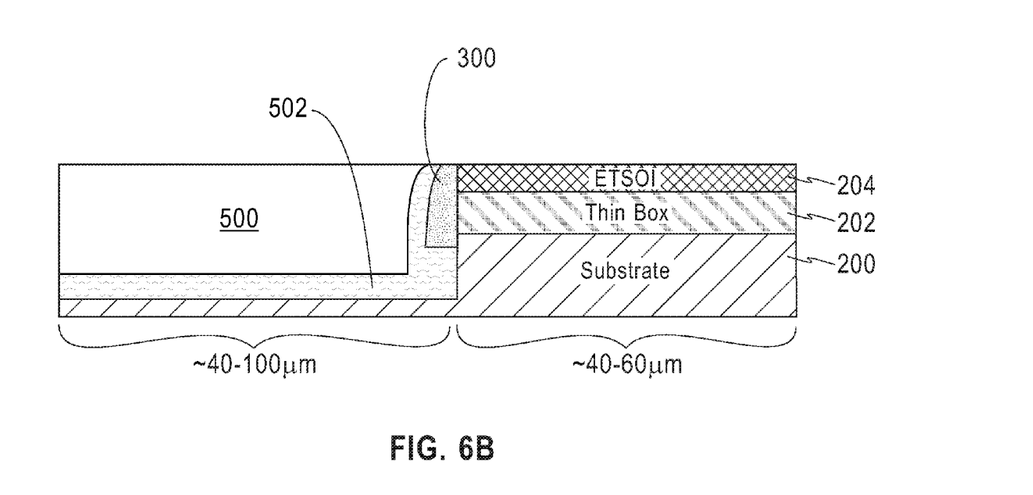
FIG. 6B illustrates an alternative embodiment after removing several layers.

Referring now to FIG. 6B, an alternative embodiment of the device is shown. In this embodiment with large pads/isolated features, the processing steps remain the same as in FIG. 6A.

Figure 7A:
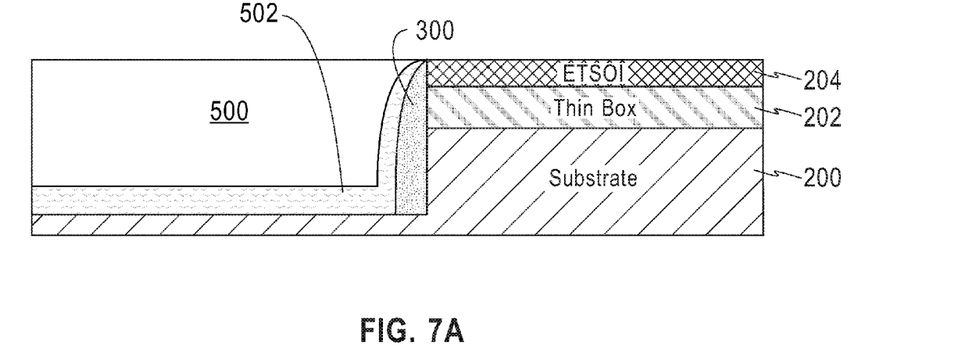
FIG. 7A illustrates an alternative embodiment with an extended spacer.
Figure 7B:
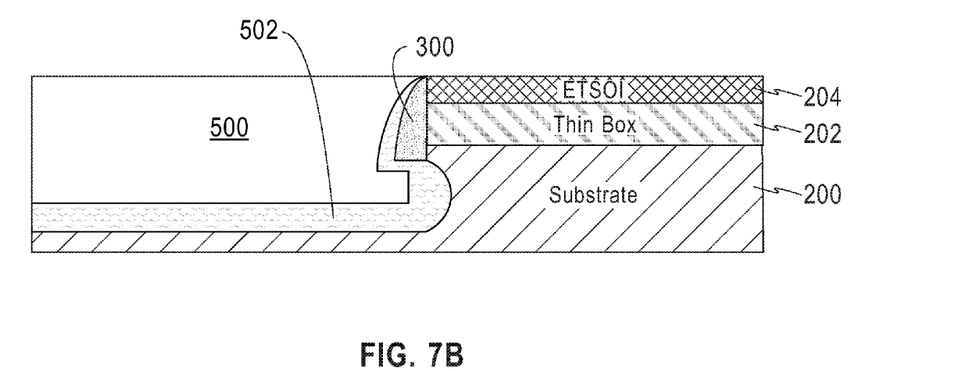
FIG. 7B illustrates an alternative embodiment with additional substrate undercutting.
Figure 7C:
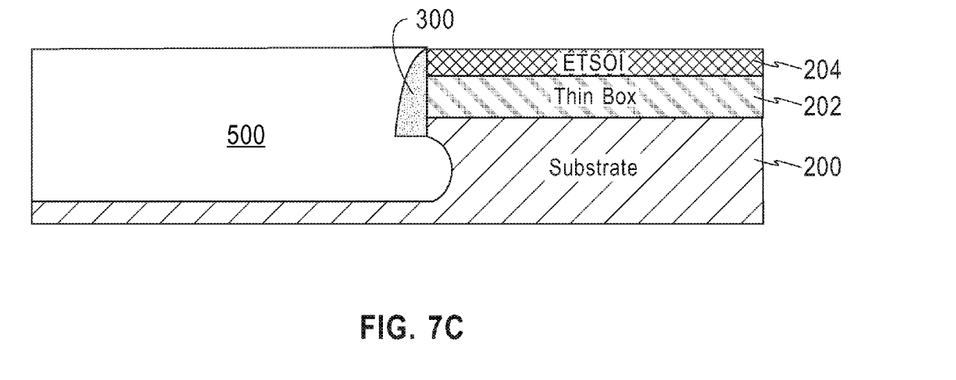
FIG. 7C illustrates an alternative embodiment without a second spacer.

Referring now to FIGS. 7A-7C, several different embodiments of the present invention are illustrated. All three of these illustrations represent further embodiments of the present invention when having large pads/isolated features. FIG. 7A illustrates an embodiment of the invention with a spacer 300 that extends to the bottom of the substrate 200. In this embodiment, the initial etch, illustrated in FIG. 2B, extends to the bottom of the substrate 200.

In the embodiment illustrated in FIG. 7B, there is an additional undercutting of the substrate. Prior to the deposition of the insulating material 502, additional isotropic etching is performed which cuts into substrate 200 underlying the thin BOX layer 202. From this, the process continues as the embodiment previously described. As a result, extra protection from shorting and epitaxial growth from the substrate to a later added raised source/drain region is provided by the extra insulation.

In the embodiment illustrated in FIG. 7C, the additional etching as in FIG. 7B is performed; the additional nitride layer, however, is omitted. For some applications, this may be suitable as the additional etching of the substrate can provide enough protection from the potential shorting problems that can occur in ETSOI devices.

Figure 8A:
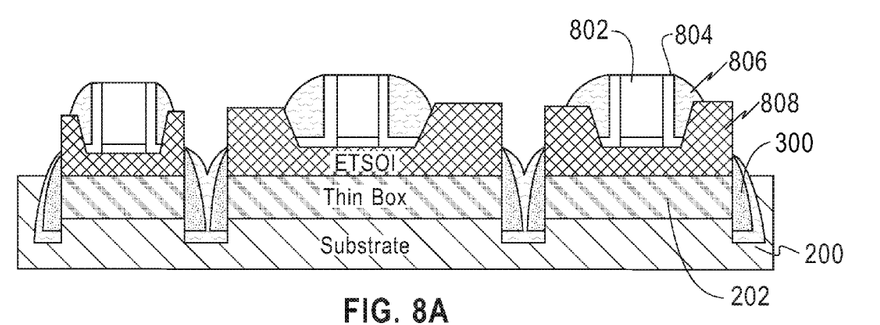
FIG. 8A illustrates the device with the addition of gate structures.
Figure 8B:
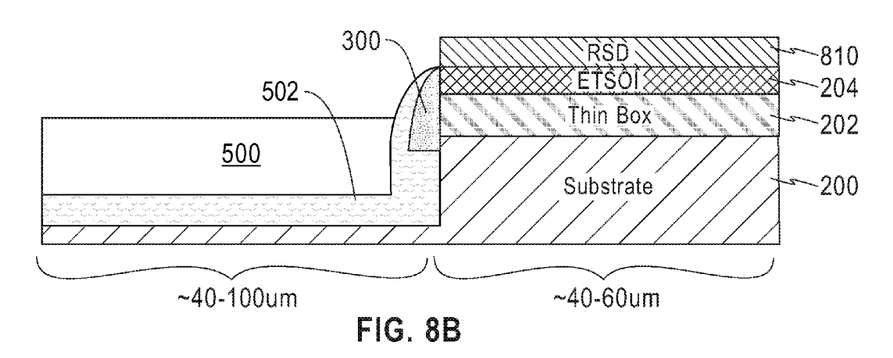
FIG. 8B illustrates an alternative embodiment with added raised source/drain regions.
Figure 9:
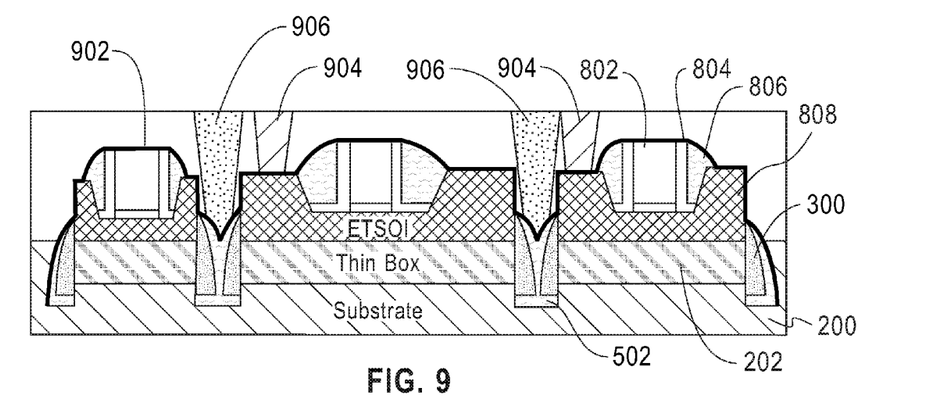
FIG. 9 illustrates the device with contact holes added.

The remaining FIGS. 8A, 8B, and 9 illustrate an embodiment of the invention with a gate structure added. The following example is for illustrative purposes only, and does not represent the only embodiment in which a gate structure can be added. Other gate structures that are known in the art and can be built over an ETSOI layer can serve the same purpose in the present invention.

Referring now to FIG. 8A, one embodiment of a gate structure that can be fabricated over the ETSOI layer is illustrated. The gate structure can be formed using known techniques of deposition, photolithography and etching. A pattern is created over the deposited materials by first applying a photoresist to the surface to be etched. Next the photoresist is exposed to a pattern of radiation which is developed into the desired pattern using a resist developer. This allows removal of the photoresist in areas that overly the portions of the device that are to be etched. After the completion of the patterning, the portions covered by the photoresist are protected from etching while the uncovered regions are etched using a selective etching process. A hard mask can be deposited over the device, and it can include silicon nitride, silicon dioxide, and the like.

The gate structure can include at least a gate conductor 802 overlying a gate dielectric. The gate conductor 802 can include any metal known in the art to act as a conductor. The gate structure can additionally include a second conductive material (not shown) overlying the gate conductor 802. This additional conducting material can include a doped semiconductor material, including a doped silicon material, such as doped polysilicon. The gate dielectric can be a dielectric material, such as silicon dioxide. Additionally, the gate dielectric can include a high-k dielectric material, such as hafnium oxide, hafnium silicate, hafnium silicon oxynitride, zirconium silicate, zirconium oxide, and the like.

A set of first spacers 804 can be formed adjacent to and in direct contact with the sidewalls of the gate structure. In this embodiment, this first set of spacers is typically narrow, with a thickness under 15 nm. First spacers 804 can be formed using known techniques of deposition and etching. First spacers 804 can include, for example, silicon nitride.

Raised source/drain regions 808 can be formed adjacent to the first spacers 804. In one embodiment, the extension regions are formed using an epitaxial growth process over the ETSOI layer. In an embodiment, the raised source/drain regions are formed by epitaxial growth of silicon germanium over the ETSOI layer. In other embodiments, the raised source/drain regions are formed by epitaxially grown carbon doped silicon.

In an embodiment, second spacers 806 can be formed adjacent to and in direct contact with first spacers 804, so as to prevent any contact from the raised source/drain regions and the gate structure. The second spacers 806 can be formed by depositing a conformal film and using a highly directional etch. Second spacers 806 can include a dielectric, such as silicon dioxide. In a next step, silicides can be formed over the raised source/drain regions.

Referring now to FIG. 9, high-k liner 902 can be deposited over the device. High-k liner 902 can act to protect the insulating material 502 that is acting as a protective spacer from the formation mis-aligned contacts. Following this, a pre-metal dielectric is additionally deposited over the device. In an embodiment, a high-density plasma oxide is used as the pre-metal dielectric, and it is deposited, for example, by high-density plasma chemical vapor deposition. In another embodiment, spin on glass is deposited over the device as the pre-metal dielectric. In another embodiment, silicon dioxide is deposited over the device. Other dielectric materials can also be used as the pre-metal dielectric.

In an embodiment, the deposited dielectric is patterned and etched to form the holes needed to contact the source/drain regions and gate conductor regions of the device. The contact holes are filled with a metal, for example tungsten, silver, copper, gold, and the like, and then a CMP is performed until flat. In the event of mis-aligned contacts 906, the sidewall of the device covered by the spacers 300 is protected. Due to the presence of first spacers 300, second spacers 502, and in some embodiments the high-k liner 902, the formation of mis-aligned contact holes does not cause the sidewalls to become exposed. Such exposure can lead to shorting between the substrate and the raised source/drain regions when the metal is added to the contact holes. Additionally, epitaxial growth of silicon on the sidewalls which can also lead to shorting between the substrate and the raised source/drain regions is prevented by the presence of the first spacers 300 and second spacers 502. Aligned contacts 904 illustrate correctly aligned contacts with no etching into the STI 208.

Referring now to FIG. 8B, an embodiment with large pads and isolated features is illustrated. Raised source/drain region 810 can be formed over ETSOI layer 204 in the same manner as raised source/drain region 808.

The method as described above can be used in the fabrication of integrated circuit chips. In an embodiment, many field effect transistors are fabricated by this method, separated by at least one shallow trench isolation region, and electrically connected to form an integrated circuit.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of manufacturing a semiconductor device, comprising:
   providing a wafer comprising a pad oxide layer overlying a first semiconductor layer overlying an oxide layer overlying a second semiconductor layer, wherein said first semiconductor layer has a thickness of 10 nm or less;
   etching a shallow trench isolation (STI) region into said wafer, extending partially into said second semiconductor layer;
   forming first spacers on sidewalls of said STI region;
   etching an area directly below and between said first spacers, exposing an underside of said first spacers;
   forming second spacers covering all exposed portions of said first spacers, wherein said pad oxide layer is removed; and
   forming a gate structure over said first semiconductor layer;
   wherein said forming said second spacers comprises:
   depositing a hydrogen-rich silicon nitride insulating material over said semiconductor device, including spaces below and between said first spacers, and performing an anneal to densify the hydrogen-rich silicon nitride insulating material;
   depositing an oxide material over said semiconductor device;
   planarizing said semiconductor device, stopping on said hydrogen-rich silicon nitride insulating material;
   etching said hydrogen-rich silicon nitride insulating material at and above said pad oxide layer; and
   etching to remove said pad oxide layer.

2. The method according to claim 1, wherein said etching said area directly below and between said first spacers comprises:
   etching into said second semiconductor layer a space between said first spacers by an isotropic etch; and
   etching by an anisotropic etch a space below said first spacers.

3. The method according to claim 2, wherein said isotropic etch comprises a wet etch with potassium hydroxide as an etchant.

4. The method according to claim 2, wherein said anisotropic etch comprises a reactive ion etching process.

5. The method according to claim 1, wherein said first spacers comprise silicon nitride.

6. The method according to claim 1, wherein a width of said STI region is in a range of 30 to 60 nanometers.

7. The method according to claim 1, wherein a width of said STI region is in a range of 40 to 100 micrometers.

8. The method according to claim 7, wherein said depositing said oxide material over said semiconductor device further comprising depositing said oxide material in said STI region.

9. The method according to claim 1, wherein said first and said second semiconductor layers comprise silicon.

10. The method according to claim 1, wherein said forming said gate structure comprises:
    depositing at least a dielectric material followed by a first gate conductor material over said first semiconductor layer;
    etching said dielectric material and said first gate conductor material to form a gate;
    forming third spacers adjacent to and in direct contact with said gate;
    forming epitaxially grown raised source/drain regions adjacent to said third spacers and overlying said first semiconductor layer;
    depositing fourth spacers adjacent to and in direct contact with said third spacers; and
    forming silicides over said epitaxially grown raised source/drain regions.

11. The method according to claim 1, wherein said second spacers completely fill the STI region.

* * * * *